(12) United States Patent
Lindemann et al.

(10) Patent No.: US 6,507,108 B1
(45) Date of Patent: Jan. 14, 2003

(54) POWER SEMICONDUCTOR MODULE

(75) Inventors: Andreas Lindemann, Lampertheim; Bernt Leukel, Hemsbach, both of (DE)

(73) Assignee: IXYS Semiconductor GmbH, Lampertheim (DE)

( * ) Notice: Subject to any disclaimer, the term of this patent is extended or adjusted under 35 U.S.C. 154(b) by 0 days.

(21) Appl. No.: 09/656,780

(22) Filed: Sep. 7, 2000

(30) Foreign Application Priority Data

Sep. 8, 1999 (DE) .......................................... 199 42 770

(51) Int. Cl.⁷ .............................................. H01L 23/34
(52) U.S. Cl. ........................ 257/724; 257/723; 257/718; 257/719
(58) Field of Search .............................. 257/500, 675, 257/685, 718, 719, 723, 778, 786, 787, 789

(56) References Cited

U.S. PATENT DOCUMENTS

| 4,731,644 | A | 3/1988 | Neidig ......................... 357/72 |
| 4,907,068 | A | 3/1990 | Amann et al. ................. 357/74 |
| 5,060,048 | A | 10/1991 | Hebenstreit et al. .......... 357/68 |
| 5,296,739 | A | 3/1994 | Heilbronner et al. ........ 257/687 |
| 5,508,560 | A | 4/1996 | Koehler et al. ............. 257/730 |
| 5,751,058 | A | 5/1998 | Matsuki ....................... 257/692 |
| 5,977,568 | A | 11/1999 | Klaka et al. ................ 257/108 |
| 5,982,031 | A | * 11/1999 | Stockmeiter ................ 257/723 |

FOREIGN PATENT DOCUMENTS

| DE | 35 08 456 A1 | 9/1986 |
| DE | 35 21 572 A1 | 12/1986 |
| DE | 283 236 A5 | 10/1990 |
| DE | 41 22 428 A1 | 1/1993 |
| DE | 41 11 247 C2 | 2/1993 |
| DE | 41 31 200 A1 | 4/1993 |
| DE | 43 38 107 C1 | 3/1995 |
| DE | 195 29 237 C1 | 8/1996 |
| DE | 196 30 173 A1 | 1/1998 |
| DE | 197 32 738 A1 | 2/1999 |
| EP | 0 265 833 B1 | 7/1991 |
| EP | 0 277 546 B1 | 6/1992 |

* cited by examiner

*Primary Examiner*—Hoai Ho
*Assistant Examiner*—Mai-Huong Tran
(74) *Attorney, Agent, or Firm*—Woodcock Washburn LLP

(57) ABSTRACT

The invention relates to a power semiconductor module (10) having a baseplate (1) on which at least one substrate (13) is arranged which is fitted with power semiconductor chips (11, 12) and can be pressed via pressure elements and contact cords (17) against the baseplate (1). The baseplate (1) has centering elements on which a frame (3) which defines fields (7) and is in the form of a grid is provided, with corresponding substrates (13) with power semiconductor chips being arranged in at least some of the fields (7), which substrates (13) can be made contact with via contact rails (15).

10 Claims, 5 Drawing Sheets

POWER SEMICONDUCTOR MODULE

FIELD OF THE INVENTION

The invention relates to a power semiconductor module having a baseplate on which at least one substrate is arranged which is fitted with power semiconductor chips and can be pressed via pressure elements against the baseplate.

BACKGROUND

When manufacturing power semiconductor modules, it is generally necessary to electrically insulate the power semiconductors or power semiconductor chips from the base body or heat sink which is used to dissipate heat. Ceramic isolators in disk form and with a metallized surface are widely used for this purpose. For example, direct copper bonding (DCB) substrates are used on one of whose surfaces the power semiconductor chips are essentially arranged, while the other surface is thermally coupled to the heat sink. The current-carrying capacities of the power switches required for higher-power applications are normally achieved by connecting individual power semiconductor chips in parallel to form a power switch. In addition, a number of power switches can be accommodated in a common can, thus simplifying the design from the assembly point of view by reducing the number of components, for example as is evident with regard to a three-phase bridge circuit for three-phase rectification or inversion, which may thus consist of only a single component instead of up to six controllable power switches and six non controllable power switches configured as discrete components. Examples of power semiconductor modules are widely known, see, for example, EP-A-0 265 833, EP 0 277 546B1.

Various methods are known for fabricating such power semiconductor modules.

By way of example, conductive connectors soldered onto the DCB substrate, in particular lugs, conductive connectors pressed onto the DCB substrate, in particular pressure contacts, and conductive connectors located in an additional insulator, for example a can frame, are used for electrical connection for the connections, to which conductive connectors the electrical connection is made for example by wire bonding, which is dependent on the insulator being fitted prior to this process.

With regard to thermal coupling to the cooling medium—typically via the underneath of the component—that surface of the DCB ceramic to which the chips are not fitted forms the underneath of the component in a module which has a DCB bottom—see DE35 21 572A1. As a rule, thermal coupling is achieved by pressing onto a typically metallic heatsink, from which heat is extracted by a cooling medium, such as air or cooling liquid, with the boundary surface between the DCB bottom and the heat sink advantageously having to be provided with an intermediate layer composed of a thermally linking medium, for example thermally conductive paste.

In a module having a bottom plate, that surface of the DCB ceramic to which the chips are not fitted is thermally coupled to a bottom plate which is generally composed of a metal or composite material; the coupling can be achieved by pressing—see DE41 31 200C2, DE41 11 247C2 and DE 41 22 428C2 typically, once again using a thermally linking medium, for example thermally conductive paste, by solder—see DE43 38 107C1 —or by other integral material joints, the latter in particular in the case of bottom plates composed of composite materials. The bottom plate for its part is then cooled which can be done, for example, by pressing against a heat sink or by applying a flow of a cooling medium, such as air or cooling liquid, subject to a suitable geometric configuration.

This prior art is subject to a number of disadvantages, as follows:

As stated above, power semiconductor modules were originally used to increase the integration level of power electronic circuit arrangements. If this aim is continued, it is necessary to. integrate power electronics together with peripheral functions such as actuation, intermediate circuit capacitors and the like in a controller close to the load: for a single-wheel drive using a three-phase motor, such a controller could be in such a form that it is placed against the motor housing, using the same cooling medium as the motor and, as electrical interfaces, could have a DC voltage feed and a bidirectional bus for information transmission. Power semiconductor modules according to the prior art in the described embodiments are not consistent with such greater integration since they are designed as enclosed units with a dedicated housing, which, owing to requirements such as mechanical robustness, occupies more volume than would be necessary for greater integration; this fact is disadvantageous both from the point of view of costs and spatial economy and with regard to the electrical behavior, inter alia since it is influenced by parasitic supply line inductances; in addition, for example, accessibility to the electrical potentials that are present in the power semiconductor module is made more difficult through the housing, necessitating a not inconsiderable design cost for connection of the module.

The reliability of the electrical connections, particularly with soldered external connections, can leave something to be desired due to thermal fatigue. Efforts are being made to counteract this situation by suitable design of the connections, for example using expanding bars or special soldering methods—see, for example, DD 283 236A5. On the other hand, if the electrical connections are produced using pressure contacts with metallic springs, then they can become soft, that is to say they can become increasingly plastically deformable, under the influence of the heat produced by the heat losses from the surrounding semiconductor chips, so that the contact pressure on the substrates will decrease. Furthermore, owing to their hardness, metallic alloys which are better for mechanical purposes often have a higher electrical resistance than materials optimized for good conduction behavior. Contact springs, which avoid these disadvantages, are generally expensive due to their particular material composition and are thus used little, for financial reasons. In any case, there is a risk that the ends of the contact springs or the contact surfaces opposite them will be ground away by scraping movements resulting from thermally dependent work by virtue of the design.

Ensuring the transfer of heat is associated with difficulties, involves complex design and is often not guaranteed over the required life of the power semiconductor module: a description of weaknesses and solutions proposed can be found, for example, in DE39 40 933 —Flexing of the soldered bottom plate—,DE43 38 107C1 —Forming for a bottom plate—,DE19 707 514A1 —Introduction of weak points in the bottom plate—DE35 08 456A1 —Contact-pressure apparatus for the substrate by means of adjusting screws and spacers—or DE4 131 200 C2 —Exerting the pressure by spring elements, which may make adjustment necessary.

Power semiconductor modules constructed according to the prior art using the pressure-contact method are frequently distinguished by complex designs; for example, a design with a specially constructed bridge element is described in DE4 131 200C2. It can be seen that such a design must be matched to the specific circuits; circuit changes lead to tool costs with corresponding delivery times, which is disadvantageous with regard to more stringent requirements for prices and delivery times, even for new application-specific power semiconductor modules.

SUMMARY

The object of the invention is thus to provide a power semiconductor module of the type mentioned initially whose design is reduced to the essential parts depending on the application and which can nevertheless be integrated better in a peripheral, for example, a controller. In the process, the greatest possible spatial economy and optimum accessibility to the electrical potentials together with thermal resistance of the connections should be ensured. Furthermore, the module to be designed should be capable of being manufactured economically using simple production processes and parts while still offering even greater flexibility for application-specific adaptations by using standard components.

This object is achieved according to the invention in that the pressure elements have elastic and conductive contact cords which are arranged between contact rails and the substrates.

Relatively strong pressure elements press the contact cords not only against these elements but also against the substrate metallizations arranged on the opposite side of the contact cords. This results in a reliable, long-life electrical connection between metallizations on the substrates, to which the semiconductor chips are electrically connected, and the pressure elements via the contact cords; furthermore, the contact cords press the substrates against the baseplate located on their opposite side, thus ensuring good heat transfer between the substrates, with the semiconductor chips to be cooled, and the cooled baseplate. According to the invention, the contact cords are in this case preferably provided with an elastic core and an electrically conductive sheath.

The arrangement and development of the contact cords according to the invention at the same time provides the precondition for an advantageous development of the overall design of the power semiconductor module according to the invention in the direction of comparatively simple manufacture, even for different application and operational fields. This is distinguished by a frame which defines fields being fixed by means of centering elements on the baseplate, with at least some of the fields accommodating corresponding substrates, which are fitted with power semiconductor chips.

This embodiment of a power semiconductor module according to the invention presets defined positions for the substrates with the semiconductor chips located on them. To match different requirements, it is possible to fill all the fields or individual fields with substrates, and then to make contact with them. There is therefore no need to change the tools for production of the frame for different applications. The same applies to the contact rails which are also provided according to the invention which, on the one hand, act as conductors for the current which flows via the substrates fitted with semiconductor chips and, on the other hand, act as force-transmitting elements. Predefinition of the arrangement via the centering elements which, according to another feature of the invention, are threaded bolts provided in the baseplate, results in the individual parts being reliably guided during the production process.

This is distinguished by the fact that opposing rails with recesses for the pressure elements which are formed as contact rails are provided on mutually opposite sides of the frame, and by the fact that the opposing rails are arranged on the centering elements. This embodiment according to the invention on the one hand clearly defines the arrangement of these opposing rails since—provided with corresponding recesses—they are simply plugged onto the centering elements. For their part, the opposing rails have recesses for holding the contact rails, which can then be arranged at right angles to them in the main plane of the baseplate. All the said parts are thus matched to one another so that correct contact is made with the power semiconductor chips by means of the contact cords of the inserted contact rails.

As a continuation of the basic idea of the invention, the contact with the chips and the overall production of the power semiconductor module according to the invention is improved if pressure clips are provided on the centering elements and on the contact rails and opposing rails. The pressure clips can approximately match the opposing rails, in terms of length and width. The required contact pressure can thus be applied to the contact rails via the pressure clips by screwing nuts onto the screws or threaded bolts which are used as centering elements.

A further advantageous refinement of the basic idea of the invention is for the frame to be in the form of a grid and for the grid of the frame to have guides, formed integrally with it, for auxiliary contacts. These guides can thus be produced in one operation together with the frame, in particular in the course of injection molding. Electrical contacts can be inserted into the guides and, for example, produce a connection to a printed circuit board which is arranged on the power semiconductor module according to the invention and, for its part, forms an interface to an additional appliance, for example a controller.

BRIEF DESCRIPTION OF THE FIGURES

Further details, features and advantages of the invention result from the following description of a preferred exemplary embodiment together with the schematic drawing and the patent claims. In the figures:

DETAILED DESCRIPTION OF THE INVENTION

Figure 1:
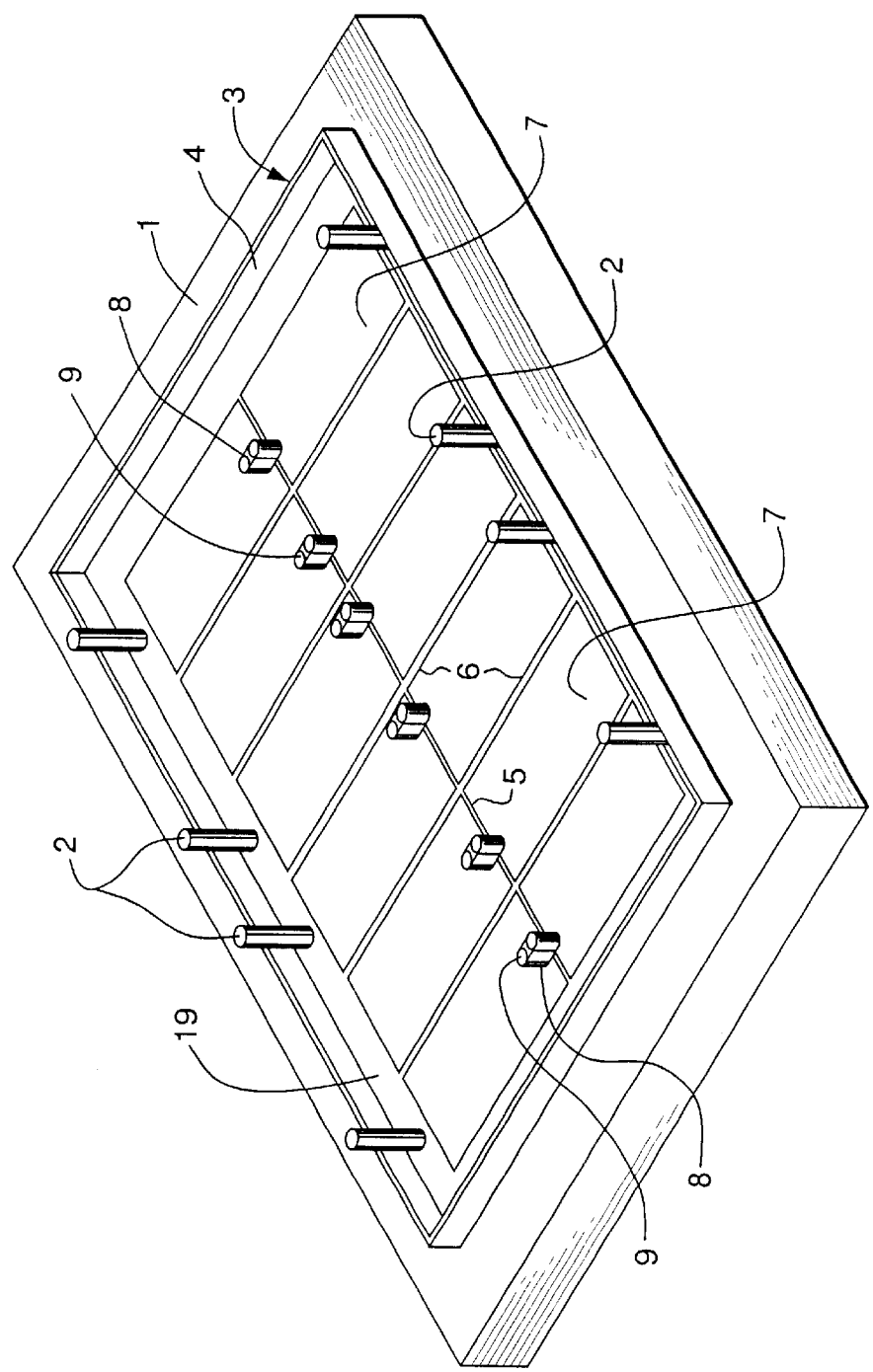
FIGS. 1 to 4 show the sequence of assembly of the major parts of a power semiconductor module according to the invention, shown in perspective.

A power semiconductor module 10 according to the invention will be explained in the following text in the sequence of assembly of a three-phase controlled bridge circuit, by way of example: the process starts with a baseplate or cold plate 1 with threaded bolts or centering elements 2 as shown in FIG. 1. As a rule, the baseplate 1 will also form the baseplate of a controller, which is not shown, which can accommodate further assemblies, in particular electronic assemblies, and in the completed form can be closed by further housing parts. The typically metallic baseplate 1 can be cooled, for example by air flowing against cooling ribs, which are not shown, or by cooling liquid flowing through integrated channels, which are likewise not specifically shown. If necessary, a medium—for example thermally conductive paste—which improves heat transfer to the substrates to be pressed into contact in a subsequent assembly step can be applied on the baseplate 1 in the region between the threaded bolts 2.

FIG. 1 also shows a frame or housing frame 3 fitted onto the baseplate 1. When the power semiconductor module is in the assembled state, this is pressed against the baseplate 1, as explained below. It is used for protection of the power semiconductor chips in that it prevents the potting compound applied to them from flowing away, and for guidance of the components mentioned in the following text during, and in some cases after, assembly. This means that the housing frame 3 is not subject to any particular requirements in terms of withstanding forces, so that it can be designed as a low-cost, thin-walled plastic part, for example made of thermosetting plastic.

As is likewise evident, inter alia, from FIG. 1, the frame 3 has a circumferential rim part 4 comprising a right-angled angle profile; furthermore, it has a longitudinal web 5 and transverse webs 6 which form a grid, which defines individual fields 7. Guides 8 are formed integrally on the longitudinal web 5, for auxiliary contacts. These have recesses 9 into which these auxiliary contacts are inserted, which are used, for example, for transmitting control signals to a printed circuit board (not shown) which is still to be provided on the module. On its limb 19, which rests on the baseplate 1 and is provided at right angles to the rim part 4, the frame 3 has openings which correspond to the centering elements 2, so that it can be placed on the baseplate 1 and is fixed there in the plane of the baseplate 1.

Figure 2:
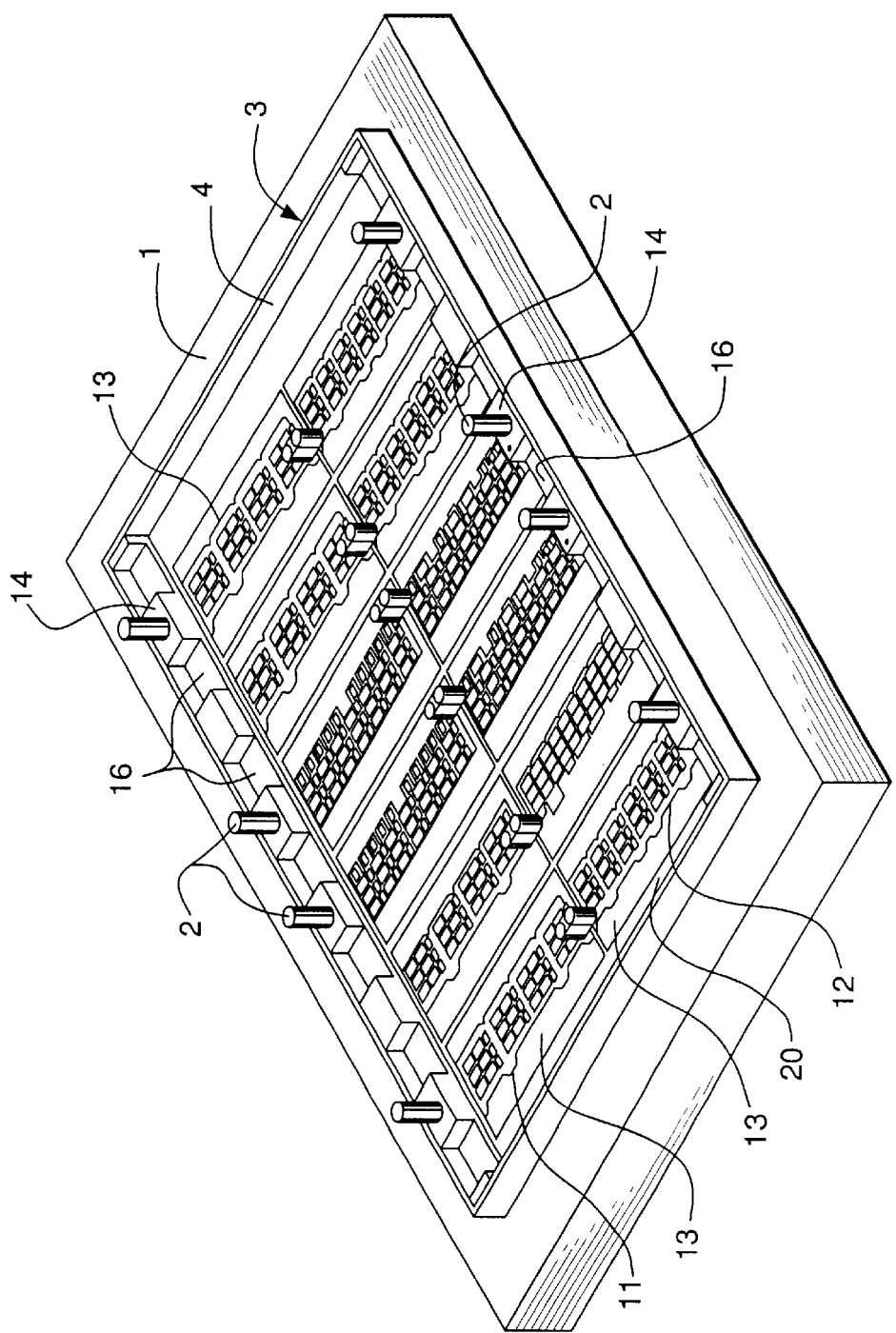

FIG. 2 shows how substrates 13 are inserted into fields 7 in the housing frame 3. These are DCB substrates, as known, on which the power semiconductor chips are arranged. It can be seen that it is possible to use substrates 13 fitted with different chips—relatively large chips 11 and relatively small chips 12 are shown—without any further design changes to the design of the frame 3. High production process efficiency is achieved by using identical substrates for all the switches. The soldered and wire-bonded substrates 13 can be checked for faults even during their production process, so that it is possible to prevent defective components from being fitted into the power semiconductor module 10. Also, as is shown, a plurality of substrates 13 can be connected in parallel in order to form a power switch with a relatively large number of chips, as can economically be implemented on a substrate: the three-phase bridge arrangement shown comprising six switches is produced using twelve substrates, that is to say two of them for each switch. The dimensions of the substrates 13 correspond to those of the fields 7 so that they are held reliably by the grid of the frame during assembly.

Figure 3:
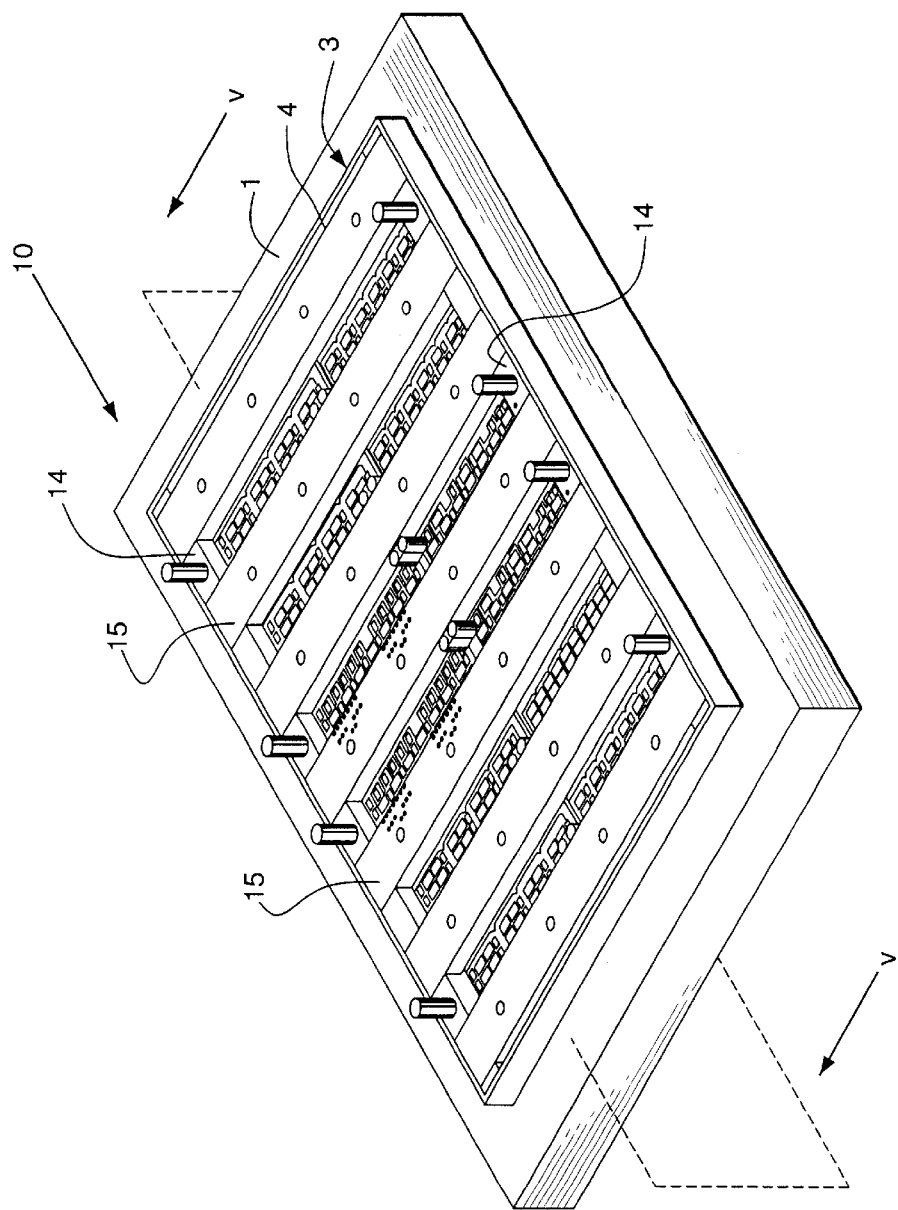

Furthermore, as is shown in particular in FIG. 2, opposing rails 14 are fitted onto the threaded bolts 2. Their object is also guidance of the contact rails to be inserted in the next assembly step, see FIG. 3. To accommodate the contact rails 15 and to fix them without any ambiguity, the opposing rails 14 are provided with recesses 16, whose cross section corresponds to that of the contact rails 15. In the exemplary embodiment shown, the recesses 16 and the contact rails 15 are dimensioned such that they end flush with the upper edge of the rim part of the frame 3 on the upper edge, that is to say in the region of the point where the threaded bolts 2 emerge from the opposing rails.

Figure 5:
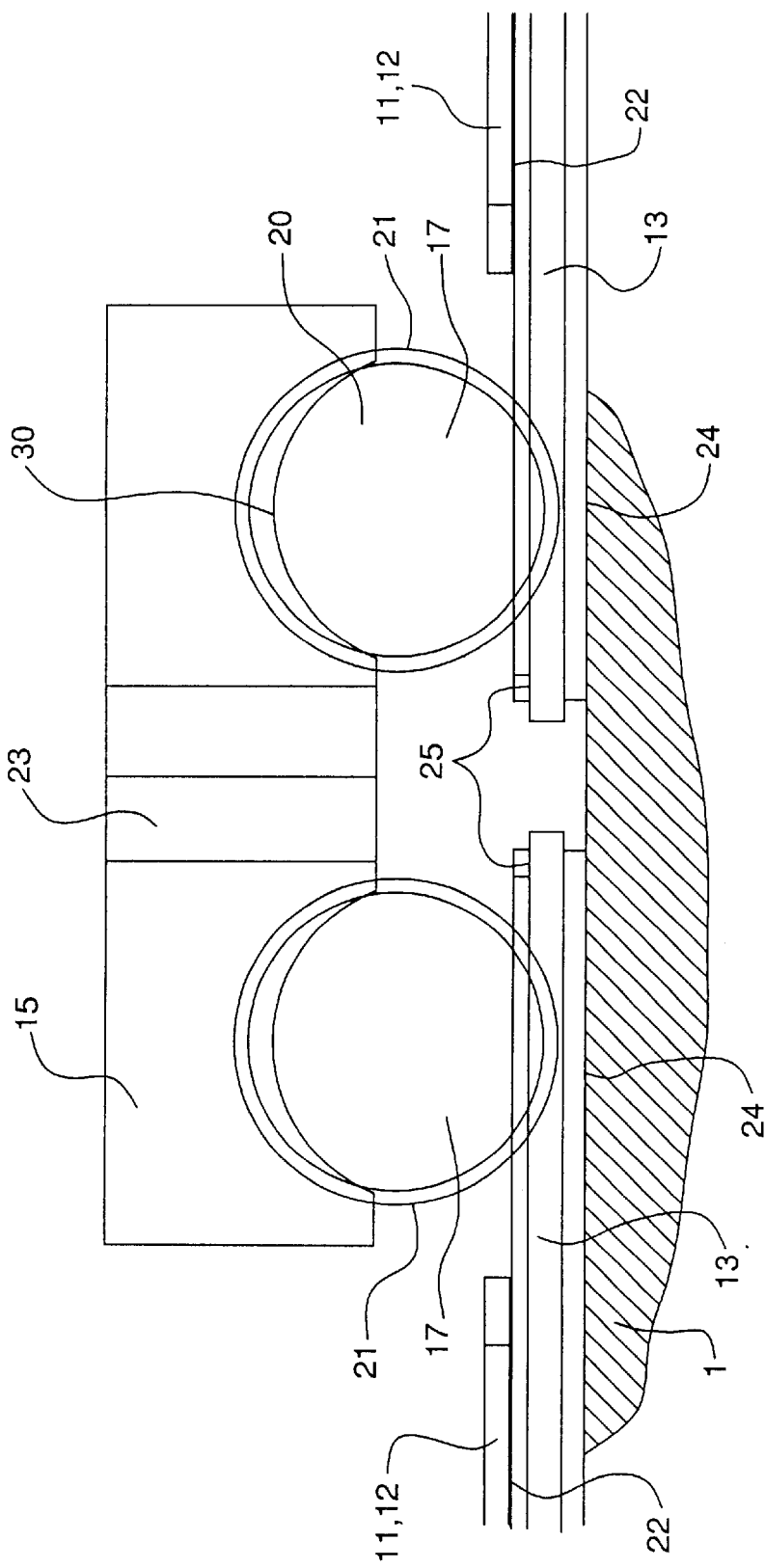
FIG. 5 shows a partial section through the subject matter of FIG. 3, along the section plane V—V.

FIG. 5 shows a cross section of a contact rail 15, of contact cords 17, and of the substrates 13 with which contact is thus made. The aim of pressing onto the substrates 13 by means of this design is on the one hand to make the electrical connection, and on the other hand to press the substrates 13 as flat as possible against the heat-dissipating baseplate 1, for thermal coupling. Advantageously designed contact cords comprise a core 20 composed of elastic material, for example silicone rubber, which is surrounded by a conductive and flexible, but not necessarily elastic, sheath 21, for example copper wire mesh. This results in decoupling between the functions of large-area pressure—which is applied by the, in particular, sufficiently heat-resistant elastomer core—and electrical contact, which is made with as little resistance as possible and for a long life even when subject to thermal/mechanical cycling.

FIG. 5 shows the contact cord 17 with its sheath 21 in the uncompressed state between the contact rail 15 and the substrate 13, in order to indicate the compression, which results on final assembly, of the regions which overlap in the illustration. In fact, in the assembled state, the contact cords 17 rest flat against the profile 30 of the contact rails 15. Possible long-term damage to the chips 11, 12 by contamination of the potting compound, to be introduced later, by the material of the contact cords 17 can be precluded by choosing an elastomer material, for example based on silicone, such as silicone rubber, for this purpose.

As can also be seen from FIG. 5, the chips 11, 12 are connected via a solder layer 22 to the substrate 13, which has an electrically conductive copper layer 25. The layer 24 is formed by a thermally conductive paste 24, which is present between the substrate 13 and the baseplate or cold plate 1.

There are preferably two contact cords 17 per contact rail 15. These extend essentially over the length of the contact rails .15, in which further recesses 23 are provided. They can be used for attachment of a printed circuit board which covers the power semiconductor module according to the invention.

Figure 4:
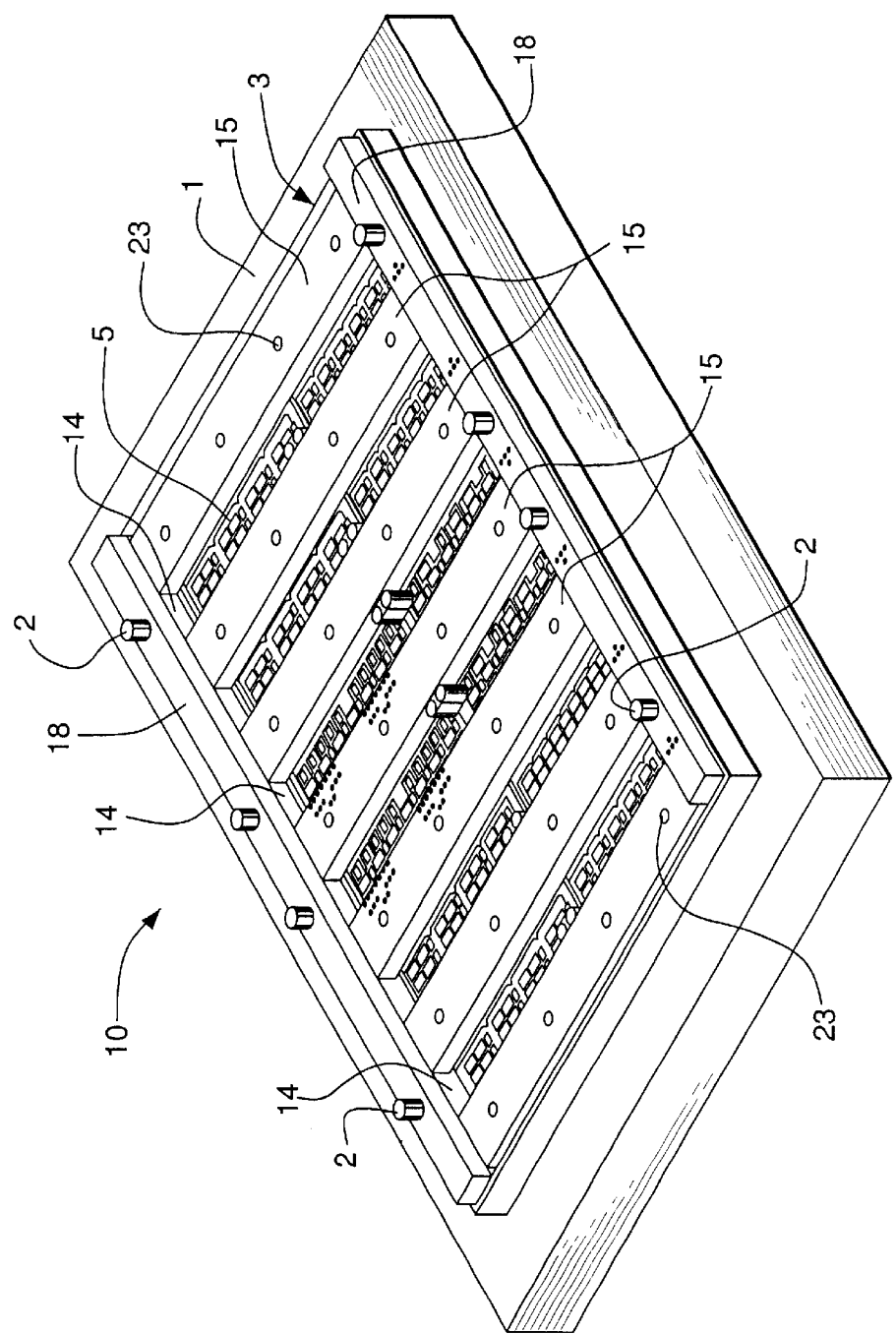

A further advantageous feature of the design according to the invention is the said guidance of the contact rails 15 in the opposing rails 14. If pressure clips 18 are placed onto the threaded bolts 2, as shown in FIG. 4, then the compression by the pressure clips 18 and opposing rails 14 onto the stop by means of nuts screwed onto the threaded bolts 2 results in a constant contact pressure irrespective of the exact torque during tightening, which minimizes the variance of relevant product characteristics such as electrical and thermal coupling of the power semiconductors.

Gate contact springs are used for electrical connection of actuation potentials required for o controllable switches. They are not loaded with relatively large currents. Mechanical guides 8 are provided in the housing frame to accommodate them and prevent them sliding away to the side, but otherwise absorb no mechanical forces.

A printed circuit board, for example, can now be mounted in a simple manner on the structure of the power semiconductor module 10 shown in FIG. 4 in the following controller assembly steps, and this is typically done by screwing it on using the recesses 23, which may be in the form of threaded holes. This printed circuit board may have contact surfaces on its side facing the contact rails, which contact surfaces make contact, due to the pressure as the screws are tightened, with the contact rails over a large area and thus with a high current carrying capacity on their surface which can be seen in FIG. 4, which contains the recesses 23. By way of example, capacitors may be arranged between the positive and negative electrical potential of the intermediate circuit on the printed circuit board, as are typically used for voltage intermediate circuit converters. The design according to the invention in this case has the particular advantage that the capacitors are located in the immediate physical vicinity of the semiconductor chips, thus contributing as a low-inductance design in particular to optimization of the switching response of the semiconductor chips. The external connection of the power semiconductor module, for example to the external power supply and to the load, typically an electrical machine, can be produced analogously to the attachment of the printed circuit board using the already mentioned screw connections, which use the recesses 23. The actuation potentials are taken from the substrates 13 by means of contact springs, as mentioned. If a printed circuit board is mounted in the described manner on the power semiconductor module, then these contact springs can transfer the actuation potentials to metallized fields arranged at appropriate points on the printed circuit board. This contact is made without any additional operations during the described process of fitting the printed circuit board. Contact by means of springs can be regarded as being adequate for actuation potentials since the currents flowing are small in comparison to those in the power circuit which, as explained, is connected via the contact rails. The gate driver will be arranged on the printed circuit board so that, once again, it is in the immediate vicinity of the semiconductor chips. This is advantageous not only for assembly purposes but also with regard to the electrical response. The arrangement of the individual components described above results from the connection sequence of the power semiconductor module according to the invention, for example, $L_+, G_1, L_1, G_2, L_-, G_4, L_2, G_3, L_+, G_5, L_3, G_6, L_-$, based on the normal designation scheme for three phase controlled bridges. The pressure clips 18 may be used as a guiding fitting aid when fitting the printed circuit board. As an additional quality improvement and cost reduction measure, a power semiconductor module 10 assembled in such a way can be tested completely at this stage so that, if necessary, components, in particular substrate 13, can still be replaced. Otherwise, the process continues with partial or complete encapsulation or potting of the power semiconductor module 10 and the fitting of the other controller components, part of which it may form.

In addition to the frame 3, the opposing rails 14 and the pressure clips 18 can also be produced from low-cost thermosetting plates.

What is claimed is:

1. A power semiconductor module having a baseplate on which at least one substrate is arranged which is fitted with power semiconductor chips and is pressed via pressure elements against the baseplate, wherein the pressure elements have elastic and conductive contact cords which are arranged between contact rails and the substrates.

2. The power semiconductor module as claimed in claim 1, wherein the contact cords have an elastic core and an electrically conductive sheath.

3. The power semiconductor module as claimed in claim 1, wherein the contact rails are provided, on a surface which makes contact with the contact cords, with a profile which is matched to them.

4. The power semiconductor module as recited in claim 1 wherein a frame which defines fields can be fixed by means of centering elements on the baseplate, with at least some of the fields accommodating corresponding substrates which are fitted with power semiconductor chips.

5. The power semiconductor module as recited in claim 4 wherein opposing rails with recesses for the pressure elements which are formed as contact rails are provided on mutually opposite sides of the frame, and wherein the opposing rails are arranged on the centering elements.

6. The power semiconductor module as recited in claim 4 wherein the centering elements are threaded bolts.

7. The power semiconductor module as recited in claim 4 wherein the frame is in the form of a grid, and wherein the grid has guides, which are formed integrally with it, for auxiliary contacts, with the auxiliary contacts producing electrical connections for at least one printed circuit board which is fitted on the contact rails.

8. The power semiconductor module as recited in claim 5 wherein pressure clips are provided on the opposing rails, which pressure clips hold down the contact rails and which are guided by centering elements.

9. The power semiconductor module as recited in claim 4 wherein the frame is in the form of a grid and is provided with raised sides.

10. The power semiconductor module as recited in claim 1 wherein the contact rails have devices, such as threaded holes, for connection of external electrical connections of the power semiconductor module which carry load current and for making large-area contact with at least one printed circuit board, which is fitted with components of a power section.

* * * * *